United States Patent [19]
Hugel et al.

[11] Patent Number: 5,886,581
[45] Date of Patent: Mar. 23, 1999

[54] AUTOMATIC OUTPUT OFFSET CONTROL FOR A DC-COUPLED RF AMPLIFIER

[75] Inventors: Ulrich Hugel, Tigard; David J. McCormick, Portland, both of Oreg.

[73] Assignee: Tektronix, Inc., Wilsonville, Oreg.

[21] Appl. No.: 906,345

[22] Filed: Aug. 5, 1997

[51] Int. Cl.$^6$ ................................. H03F 3/08; H03G 3/30
[52] U.S. Cl. ........................ 330/308; 330/136; 330/285
[58] Field of Search ................................... 330/308, 285, 330/136, 127, 59, 297, 9; 250/214 A, 214 AG

[56] References Cited

U.S. PATENT DOCUMENTS

| | | | |
|---|---|---|---|
| 4,641,378 | 2/1987 | McConnell et al. | 330/59 |
| 4,889,985 | 12/1989 | Allsop et al. | 250/214 A |
| 5,138,274 | 8/1992 | Nakanishi et al. | 330/136 |
| 5,410,282 | 4/1995 | Larrick et al. | 330/149 |

FOREIGN PATENT DOCUMENTS

| | | | |
|---|---|---|---|
| 2038127 | 7/1980 | United Kingdom | H03F 1/56 |

Primary Examiner—Robert Pascal
Assistant Examiner—Patricia T. Nguyen
Attorney, Agent, or Firm—William K. Bucher

[57] ABSTRACT

An automatic output offset control circuit for a DC-coupled RF amplified optical-to-electrical converter has a photodiode for converting an optical signal to an electrical signal. The current from one side of the photodiode is coupled into the input of a bipolar RF amplifier that generates a voltage output. The current from the other side of the photodiode is sensed for generating a voltage that is compared with the output of the RF amplifier. Any mismatch between the sensed current and the RF amplifier generates an error signal that is used to control the DC bias supplies of the RF amplifier. The DC bias supplies are adjusted in unison to produce the correct offset at the amplifier output for the given photodiode current while maintaining a constant AC-gain. The circuit automatically corrects for the DC-coupled output offset drift and variations of the RF bipolar amplifier. The circuit may be implemented using either voltage or current signals to the feedback circuit.

42 Claims, 4 Drawing Sheets

AUTOMATIC OUTPUT OFFSET CONTROL FOR A DC-COUPLED RF AMPLIFIER

BACKGROUND OF THE INVENTION

The present invention relates generally to offset controls for amplifiers and more specifically to an automatic output offset control for a DC-coupled RF amplifier for use in an optical-to-electrical converter.

Optical-to-electrical (O/E) converters are used for converting an optical signal into an electrical signal, such as the optical transport signals used in the telecommunications industry. These optical transport signals have bit-rates ranging from 51.840 Mb/s for OC-1 to 2488.320 Mb/s for OC-48. To accurately convert such high bit-rate optical signals, O/E converters need to have a wide bandwidth with no DC offset. The bandwidth of an O/E converter for an OC-48bit-rate is in the range of 2 GHz referenced to a fourth order Bessel-Thompson response at the 3 db point. High frequency amplifiers are used in such O/E converters in which the amplifier output is DC-coupled. Generally, high frequency RF amplifiers are AC coupled with a blocking capacitor on the output and a bias voltage in the range of 5 volts. DC coupling is needed for O/E converters for accurate measurements of the optical signal. DC offset and other non-ideal characteristics of the amplifier in the O/E converter affect the steady-state voltage level following fast rising and falling incident optical edges which degrades the performance for extinction ratio measurements, absolute optical power measurements, and the like.

Previous O/E converters, such as the P6701A and the P6703A Opto-Electronic converters, manufactured and sold by Tektronix, Inc., the assignees of the present invention, overcame the DC offset and temperature drift problem by providing a current feedback to the input of a transimpedance amplifier. The P6701A/P6703A include a photodiode for converting the optical signal into an electrical current. The anode current is coupled into the input of a high frequency transimpedance amplifier whose output is a voltage representative of the optical signal. The cathode current from the photodiode is sensed and converted to a voltage by a precision low frequency amplifier and compared with the output voltage of the transimpedance amplifier. An error signal is generated based on the difference between these voltages, which is integrated and used to generate a current that is fedback and added to the current from the photodiode at the input of the amplifier to mimic the DC offset at the output of the amplifier. The feedback current is automatically adjusted until the voltage error is zero. The sign of the feedback current is positive or negative depending on the sign of the offset at the output.

Picometrics, Inc., Ann Arbor, Michigan, manufactures and sells a family of optical-to-electrical converters having a photodiode for converting an optical input signal into a corresponding electrical current. The current signal is coupled to a high frequency amplifier for generating a voltage signal representative of the optical input signal. A variable resistor is provided for adjusting the bias voltage on the amplifier to set the output to ground at a particular current input to the amplifier and at a particular temperature. One drawback to this open loop system is that temperature varies the DC offset and other nonlinearities of the amplifier causing degradation of various measurements.

What is needed is an optical-to-electrical converter having a closed loop system for controlling DC offset and other nonlinearities on the output of a DC-coupled RF amplifier. The automatic output offset control circuit needs to vary the bias voltages on the RF amplifier as the temperature and operating parameters of the optical-to-electrical converter vary over time to minimize the DC offset and other nonlinearities of the amplifier.

SUMMARY OF THE INVENTION

Accordingly, the present invention is directed to an automatic output offset control circuit for a DC-coupled RF amplified optical-to-electrical converter having a current source for generating a current output, such as an optical transducer for generating a current from an optical power source. In the preferred embodiment of the present invention the optical transducer is implemented as a PIN photodiode. An amplifier is coupled to receive the current output from one side of the current source for generating a first signal output representative of the current output. In the preferred embodiment of the present invention, the amplifier is a bipolar Darlington RF analog amplifier. Means are coupled to the other side of the current source for sensing the current of the current source and generating a second signal proportional to the current source current. Means are provided for comparing the first and second signals for generating an error signal representative of any mismatch between the first and second signals. A voltage control circuit is coupled to receive the error signal for generating power supply bias output voltages to the amplifier to correct DC-coupled offset drift and variations at the output of the amplifier.

The current sensing means may be implemented as a sensing resistor coupled to sense the current of the current source and a differential amplifier having a first input coupled to one side of the resistor and a second input coupled to the other side of the resistor for generating a voltage output representative of the current passing through the resistor. An alternative implementation of the current sensing means includes an operational amplifier connected as a transimpedance amplifier having an inverting input coupled to the current source and one side of a feedback resistor that has its other side coupled to the output of the amplifier. The non-inverting input to the operational amplifier is coupled to a reference voltage with the operational amplifier generating a voltage output representative of the current passing through the resistor and the voltage reference. The voltage reference is subtracted from the voltage output of the operational amplifier by a subtracting circuit for generating a voltage representative of the current passing through the resistor. In the preferred embodiment of the present invention, the current source current is sensed by a current mirror implemented with an operational amplifier and a FET. The operational amplifier functioning as a differential amplifier having a first input is coupled to a voltage source and a second input is coupled to receive a voltage signal representative of the sensed current of the current source for generating a voltage output representative of the current passing through the resistor. The voltage output controls the gate of the FET operating as a voltage-to-current converter for producing a current mirror having an output equal to the current output of the current source. The current mirror may also be implemented with an appropriate connection of transistors, such as a Wilson current mirror or the like.

The comparing means is implemented in the preferred embodiment as a current summing node or common node coupled to the input of a transimpedance amplifier for generating the error signal. Alternatively, the comparing means may be implemented as a voltage summing node coupled to the input of a voltage amplifier for generating the error signal.

The voltage control circuit includes an integrating low pass filter receiving the error signal from the comparing means for generating a control voltage correction signal coupled to a voltage regulator for generating the power supply bias voltages proportional to the control voltage. In the preferred embodiment of the present invention the voltage regulator includes a first voltage regulator circuit receiving the control voltage from the integrating low pass filter for generating a negative power supply bias voltage proportional to the control voltage. A second voltage regulator is coupled to receive the negative power supply bias voltage through a variable resistor for generating a positive power supply bias voltage wherein the variable resistor is adjusted to produce a nominal difference between the negative power supply bias voltage and the positive power supply bias voltage, preferably in the range of about a 10 volt difference.

In an alternative embodiment of the voltage regulator, a first transistor receives the control voltage signal from the integrating low pass filter for driving the transistor base for generating a negative power supply bias voltage. A second transistor generates a positive power supply bias voltage. A comparator receives at one input a summed average value of the inverted negative power supply bias voltage output and the positive power supply bias voltage output and at the other input a reference voltage for generating an output for driving the second transistor base to produce a difference between the negative power supply bias voltage and the positive power supply bias voltage that is equivalent to twice the reference voltage on the comparator.

The automatic output offset control circuit for a DC-coupled RF amplified optical-to-electrical converter may also be digitally implemented. In the broadest aspect of the digital implementation, digitization can start with the generating means where the current source is sensed and end with the generation of control voltage correction values to the voltage regulator. The output of the amplifier would also be digitized to produce digital values that would be compared with the digital values from the current sensing means.

In one implementation, a first analog-to-digital converter is coupled to receive the first signal for generating digital values representative of the first signal and a second analog-to-digital converter is coupled to receive the second signal for generating digital values representative of the second signal. A controller operating under program control receives the digital values representative of the first and second signals and compares these digital values for generating digital error values representative of any mismatch between the first and second digital values. The controller further includes a digital memory for storing the program controls and the first and second digital values and the digital error values. In one embodiment of the digital implementation, the comparing means further includes a digital-to-analog converter coupled to receive the digital error values for generating the error signal. In an alternative embodiment, the controller implements an integrating low pass filter function for generating control voltage correction values coupled to the voltage regulator for generating the power supply bias voltages proportional to the control values.

In another embodiment of the digitally implemented automatic output offset control circuit for a DC-coupled RF amplified optical-to-electrical converter the first and second signals are coupled to the input of a multiplexer having an output coupled to selectively receive the first and second signal in response to a control signal. An analog-to-digital converter is coupled to receive the output from the multiplexer for generating digital values representative of the first and second signal and a controller operating under program control, as previously described, generates the control signal for selectively coupling the first and second signals to the analog-to-digital converter and receives the digital values representative of the first and second signals. The controller compares these digital values for generating digital error values representative of any mismatch between the first and second digital values. The digitally implemented automatic output offset control circuit for a DC-coupled RF amplifier using the analog multiplexer for selectively coupling the first and second signals to the A/D converter may also be implemented using the digital-to-analog converter for converting the digital error values from the controller to the analog error signal or with the controller performing the integrating low pass filter function for generating the control voltage correction values coupled to the voltage regulator for generating the power supply bias voltages proportional to the control values.

The objects, advantages and novel features of the present invention are apparent from the following detailed description when read in conjunction with the appended claims and attached drawings.

DETAILED DESCRIPTION OF THE PREFERRED EMBODIMENT

The automatic output offset control for a DC-coupled RF amplifier of the present invention is a closed loop system for controlling DC offset and other nonlinearities on the output of a DC-coupled RF amplifier, such as used in an optical-to-electrical converter. The automatic output offset control circuit varies the bias voltages on the RF amplifier as the temperature and operating parameters of the optical-to-electrical converter vary over time to minimize the DC offset and other nonlinearities of the amplifier. The automatic output offset control circuit of the present invention uses both sides of a current source to generate first and second signals that are summed to produce an error signal for controlling the bias voltages on the amplifier. The preferred embodiment of the present invention is implemented using analog circuitry but may also be implemented using digit circuitry as will be described below. Further, the closed loop system of preferred embodiment will be described in terms of current signals but may be equally implemented using voltage signals as is well known in the art.

Figures 1, 2, 3:
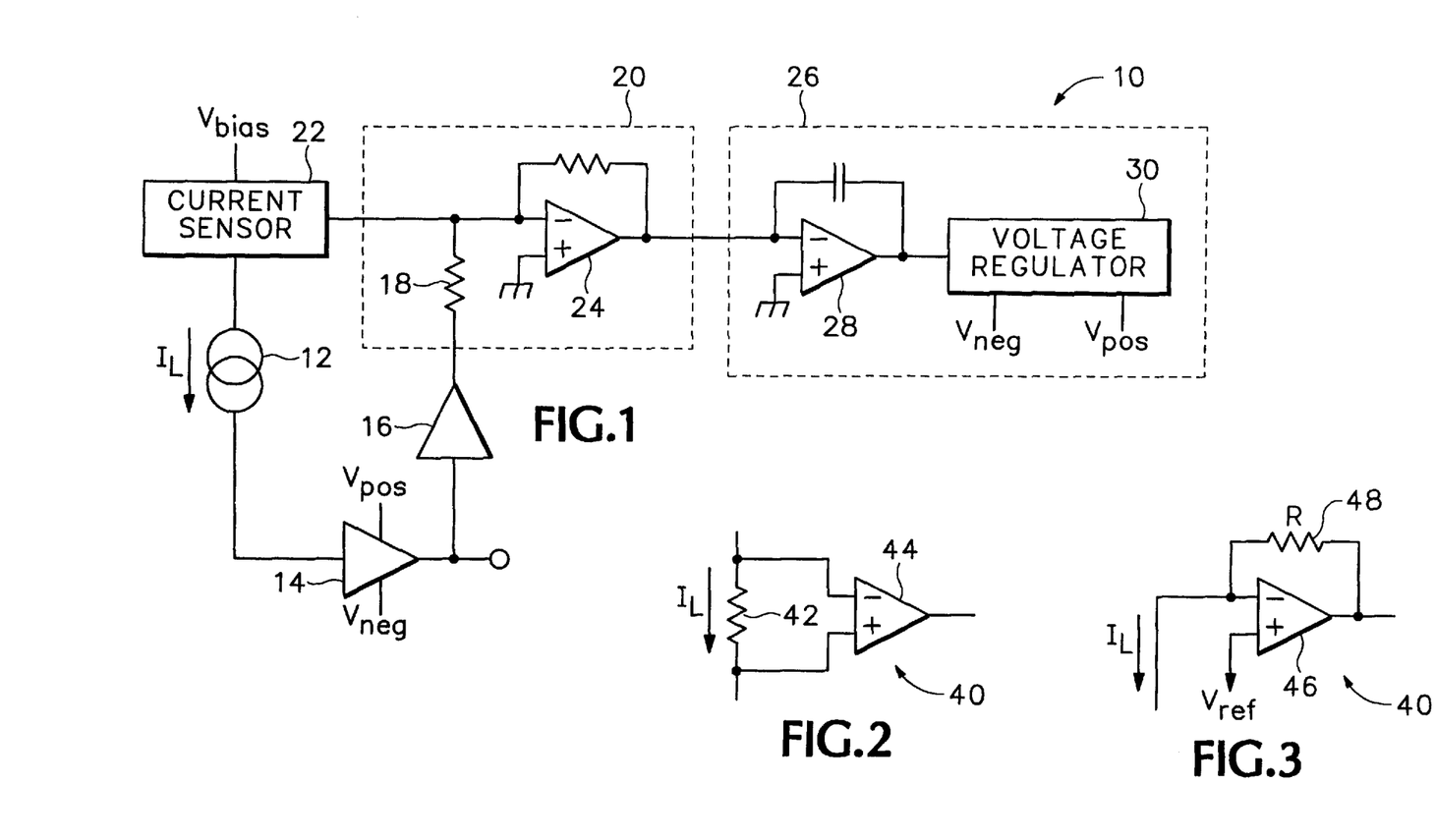
FIG. 1 is a representative block diagram of the automatic output offset control circuit for a DC-coupled RF amplifier optical-to-electrical converter according to the present invention.
FIG. 2 is one embodiment of a current sensing circuit for use in the automatic output offset control circuit for a DC-coupled RF amplifier optical-to- electrical converter according to the present invention.
FIG. 3 is another embodiment of a current sensing circuit for use in the automatic output offset control circuit for a DC-coupled RF amplifier optical-to-electrical converter according to the present invention.

Referring to FIG. 1, there is shown a representative block diagram of the automatic output offset control for a DC-coupled RF amplifier 10 according to the present invention. The automatic output offset control 10 includes a current source 12 generating a current $I_L$ that is coupled from one side of the current source 12 to the input of amplifier 14. The voltage output of amplifier 14 is coupled to a voltage buffer circuit 16 functioning as a low pass filter whose output is coupled to resistor 18 in comparing means 20. A current sensing means 22 senses the current $I_L$ on the other side of the current source 12 and generates an output signal proportional to the sensed current. The current $I_L$ may be sensed in a number of different ways to be described in greater detail below, including being sensed by a current mirror. The output of the current sensing means 22 is coupled to the comparing means 20. The comparing means includes an operational amplifier 24 functioning as a transimpedance amplifier where the inverting input to the amplifier 24 acts as a current summing node for the signal from the current sensing means 22 and the signal from the amplifier 14. Any mismatch between the signal from the current sensing means 22 and the amplifier 14 produces an error signal on the output of transimpedance amplifier 24. The error signal is coupled to a voltage control circuit 26 that includes an operational amplifier functioning as an integrating low pass filter 28 and a voltage regulator 30. The integrating low pass filter 28 generates a control voltage correction signal that is coupled to the voltage regulator 30 for generating power supply bias voltages for the amplifier 14 that are proportional to the control voltage. The power supply bias voltages from the regulator 30 are adjusted in unison to produce a zero offset at the amplifier 14 output for a given amount of $I_L$ current while maintaining a constant AC-gain.

The current sensing means 22 of the present invention may be implemented in a number of ways. The controlling characteristic of the various implementations is that all the current going into the current sensing node comes out of the node. In the automatic output offset control circuit 10 of the present invention, this means that current sensing means 22 on one side of the current source 12 does not remove any of the current available for amplifier 14 use. Referring to FIG. 2, there is shown a first embodiment of a current sensor 40. A resistor 42 is coupled in series with the current source 12 (not shown) with the current $I_L$ flowing through the resistor 42 equaling the current output of the current source 12. One side of the resistor 42 is coupled to one input of a differential amplifier 44 while the other side of the resistor 42 is coupled to the other input of the amplifier 44. The output of the differential amplifier 44 is a voltage representative of the current flowing through the resistor 42.

A second embodiment of the current sensor 40 is shown in FIG. 3. An operational amplifier 46 functioning as a current-to-voltage converter has its non-inverting input coupled to a voltage reference. The feedback resistor 48 is coupled between the output and inverting input of the amplifier 46. Current $I_L$ is drawn from the output to the inverting input of the amplifier 46 through resistor 48. The voltage output of the amplifier is equal to $(I_L \times R) + V_{ref}$. In this embodiment, a subtracting circuit is provided to remove the $V_{ref}$ voltage from the output signal for producing a voltage representative of the current flowing through the current source. In an implementation of the present invention where voltage signal are used, the voltage outputs of the current sensing means 22 and the buffer amplifier 16 are coupled to a voltage summing node. In the preferred embodiment of the present invention, the current of the current source 12 is sensed by a current mirror implemented with an operational amplifier and a JFET. The current mirror may also be implemented with an appropriate connection of transistors, such as a Wilson current mirror or the like.

Figure 4:
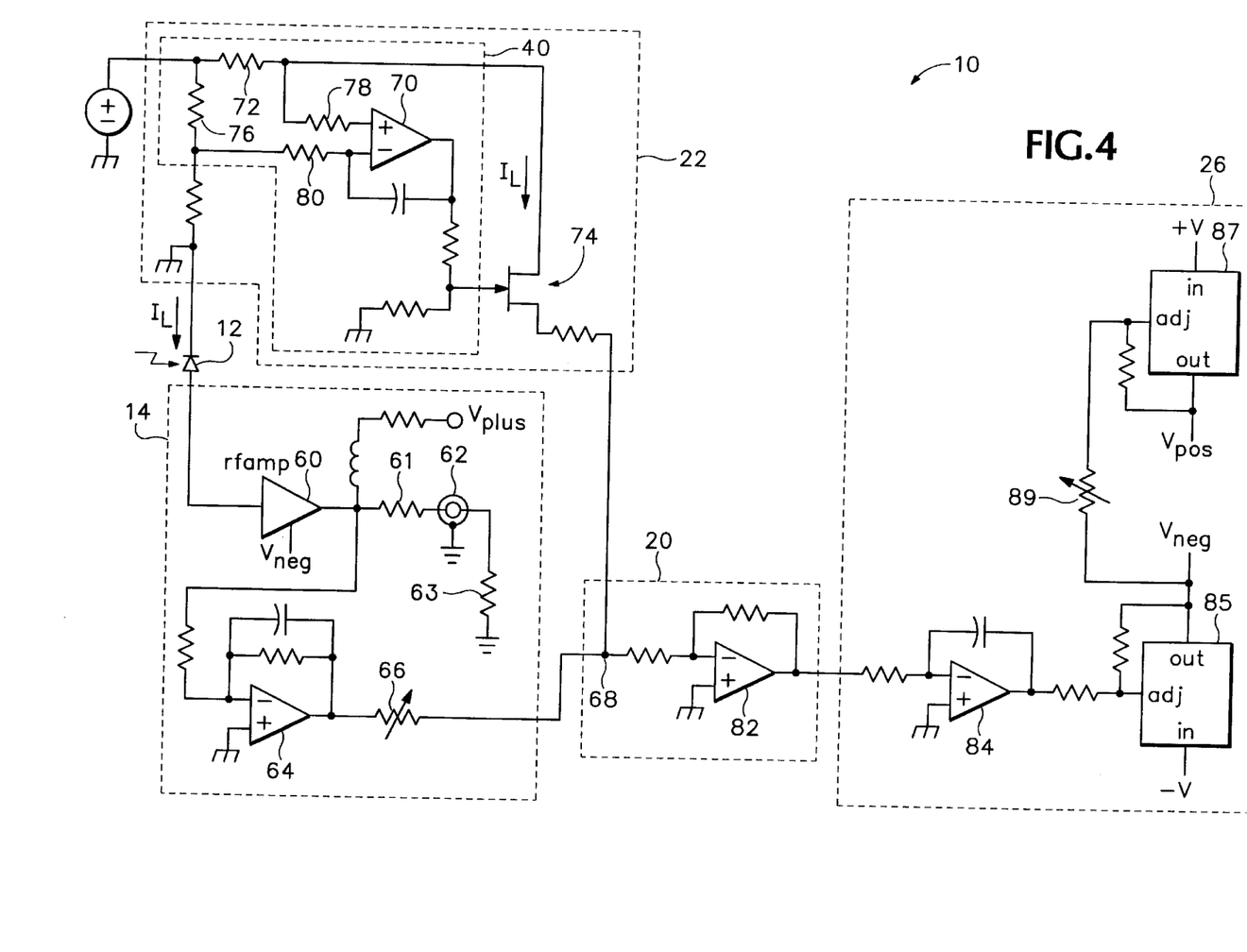
FIG. 4 is a representative schematic drawing of the automatic output offset control circuit for a DC-coupled RF amplifier optical-to- electrical converter according to the present invention.

Referring to FIG. 4, there is shown a schematic representation of the preferred embodiment of the automatic output offset control circuit 10 of the present invention implemented with analog circuitry. The current source 12 is implemented as an optical transducer generating a current output from an optical power source. In the preferred embodiment, the optical transducer is a PIN photodiode, such as manufactured and sold by Picometrics, Inc., Ann Arbor, Mich., under Part No. D15. The PIN photodiode 12 receives an optical input signal and generates a linear current signal representative of the power of the optical signal. The current from one side of the PIN photodiode 12 is coupled into the input of RF amplifier 60, such as bipolar Darlington RF amplifier, manufactured by Hewlett-Packard, Co., Palo Alto, Calif., under Part No. INA-10386, a GaAs FET, or the like. In the preferred embodiment of the invention, the output of the RF amplifier 60 is coupled via an external 50 ohm coaxial cable 62 to a termination load 63. Other termination loads, as represented by resistors 61 and 63, may be employed at the output of the RF amplifier 60 without departing from the scope of the inventions as set forth in the appended claims. In the implementation of the present invention, the load resistance of resistor 61 in series with the external 50 ohm coaxial cable is zero ohms. The output of the RF amplifier 60 is also coupled to a unity gain buffer amplifier 64 acting as a low pass filter. The output of the buffer amplifier 64 is applied to a variable resistor 66. The other side of the resistor 66 is coupled to a common node 68 in the comparing means 20 that receives a current signal from the current sensing means 22. The variable resistor 66 is adjusted empirically so that the same amount of current is flowing through resistor 66 and into node 68 as is flowing from FET 74 into node 68, for a given stable average optical power level input.

The current sensing means 22 includes a current sensor 40 having a differential amplifier 70 coupled to receive a voltage input from a voltage source at one input and a voltage signal representative of the sensed current of the PIN photodiode 12 at the other input. The voltage source includes resistor 72 that develops a voltage across it in response to current flowing through FET 74. The current of the PIN photodiode 12, which is sensed on the opposite side of the photodiode from the RF amplifier 60, passes through a resistor 76 developing a voltage across it. Resistors 72 and 76 have the same resistive values, which in the preferred embodiment are 1 KΩ. Differential amplifier 70 input resistors 78 and 80 are 10 KΩ in the preferred embodiment. The voltage output of the differential amplifier 70 is integrated and low pass filtered and coupled to the gate of FET 74 acting as a voltage-to-current converter. The resistance of FET 74 decreases as the voltage on the gate increases allowing more current to flow through FET 74 causing more current to flow through resistor 72 and changing the voltage on the input of the differential amplifier 70. Eventually an equilibrium is reached where the average current flowing through the voltage source resistor 72 is equal to the average current flowing through the sensing resistor 76 resulting in zero voltage difference at the input of differential amplifier 70. In effect, the photodiode 12 current is duplicated in the Drain-Source path of the FET 74 via a feedback loop comparing the voltage difference between the photodiode I-V conversion over a resistor 76 versus the FET drain current over the same but separate resistive element 72. In this way a one to one current mirror of the average photodiode current is generated.

The current signal from the current sensing means 22 and the current signal from the RF amplifier 60 are summed at common node 68 in the comparing means 20. The common node 68 is the virtual ground (inverting) input to operational amplifier 82 functioning as a transimpedance amplifier. If the current flowing into the common node 68 is not equal to the current flowing out of node 68, then a differential voltage relative to ground is generated that produces a buffered error signal on the output of amplifier 82. The error signal is coupled to the input of operational amplifier 84 functioning as an integrating low pass filter in voltage control circuit 26. The output of the integrating low pass filter 84 drives a voltage regulator circuit that includes first and second voltage regulator integrated circuits 85 and 87 and a variable resistor 89. The voltage regulator integrated circuits 85 and 87 are three terminal IC regulators common in the electronic industry with each regulator having an input terminal, output terminal, and adjustment terminal. The control voltage correction signal from the integrating low pass filter 84 is coupled to the adjustment terminal of IC regulator 85, such as a LM337, that has its input terminal coupled to a $-V$ voltage supply. A $V_{neg}$ power supply bias voltage for the RF amplifier 60 is generated at the output terminal of regulator 85 that is proportional to the input control voltage from integrating low pass filter 84. The $V_{neg}$ power supply bias voltage is coupled to the adjustment terminal of IC regulator 87, such as a LM317, through variable resistor 89. The input terminal of regulator 87 is coupled to a +V voltage supply. A $V_{pos}$ power supply bias voltage for the RF amplifier 60 is generated at the output terminal of regulator 87 that is set by the variable resistor 89. In the preferred embodiment, the variable resistor is adjusted to produce a nominal difference between the $V_{neg}$ power supply bias voltage and the $V_{pos}$ power supply bias voltage in the range of 10 volts. The $V_{neg}$ and $V_{pos}$ power supply bias voltages shift in unison with respect to ground to minimize the DC offset and other nonlinearities of the RF amplifier 60 and to maintain overall constant differential supply voltages for amplifier 60, thereby maintaining relatively constant RF gain through the amplifier 60.

Figure 5:
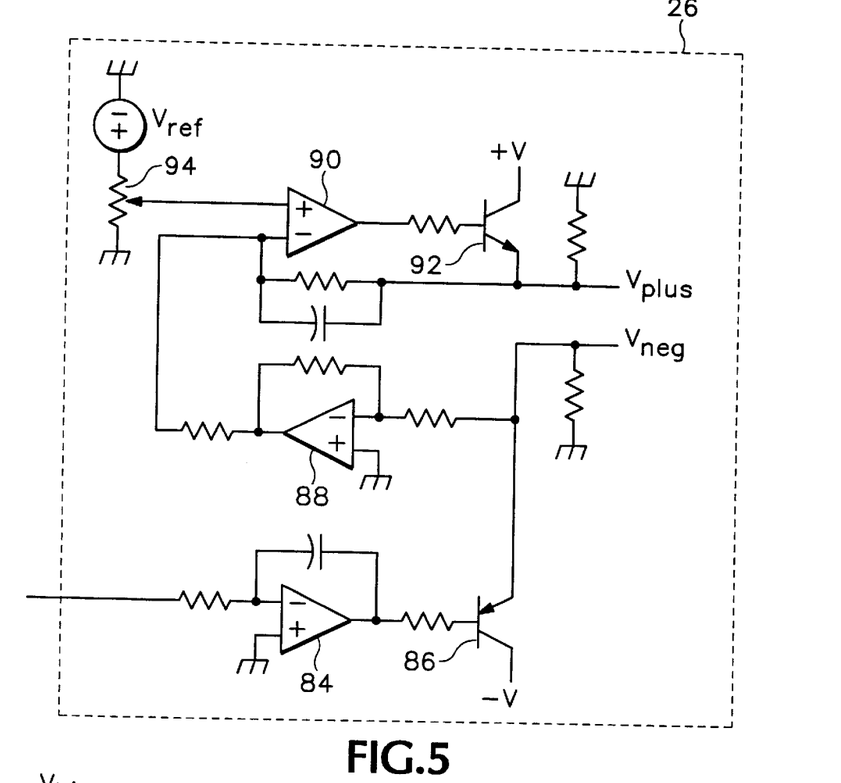
FIG. 5 is a representative schematic drawing of an alternative embodiment of the voltage regulator in the automatic output offset control circuit for a DC-coupled RF amplifier optical-to- electrical converter according to the present invention.

FIG. 5 shows a representative schematic drawing of an alternative voltage regulator circuit for controlling the power supply bias voltages of the RF amplifier 60. The output of the integrating low pass filter drives the base of transistor 86 controlling the $V_{neg}$ power supply bias voltage for the RF amplifier 60. The $V_{neg}$ voltage is inverted by buffer operational amplifier 88 and coupled to the common node of operation amplifier 90 functioning as a comparator. The output of the comparator 90 drive the base of transistor 92 controlling the $V_{pos}$ power supply bias voltage for the RF amplifier 60. The $V_{pos}$ voltage is coupled to the common node of the operation amplifier 90 where the average value of the $V_{neg}$ and the $V_{pos}$ is summed at the common node. The comparator 90 output drives the $V_{pos}$ until the difference between the $V_{neg}$ and $V_{pos}$ is equivalent to twice a reference voltage $V_{ref}$ applied at the non-inverting node of the comparator 90. The $V_{ref}$ is developed across a variable resistor 94. For example, if $V_{ref}$ is 5.0 volts, and $V_{neg}$ is driven to $-6.8$ volts to produce zero error at the current summing node 68, then $V_{pos}$ is driven to +3.2 volts ($-6.8V+(2\times V_{ref})$). The power supply bias voltages $V_{neg}$ and $V_{pos}$ are adjusted in unison to produce a zero offset at the amplifier 14 output for a given amount of $I_L$ current while maintaining a constant AC-gain.

A further alternative voltage control circuit 26 according to the present invention would keep $V_{pos}$ fixed with respect to ground and varying the $V_{neg}$ power supply bias voltage. While this embodiment provides automatic DC offset control for the output of the RF amplifier 60, it may vary the frequency response of the amplifier, the power dissipation of the amplifier, and the output voltage.

Figure 6:
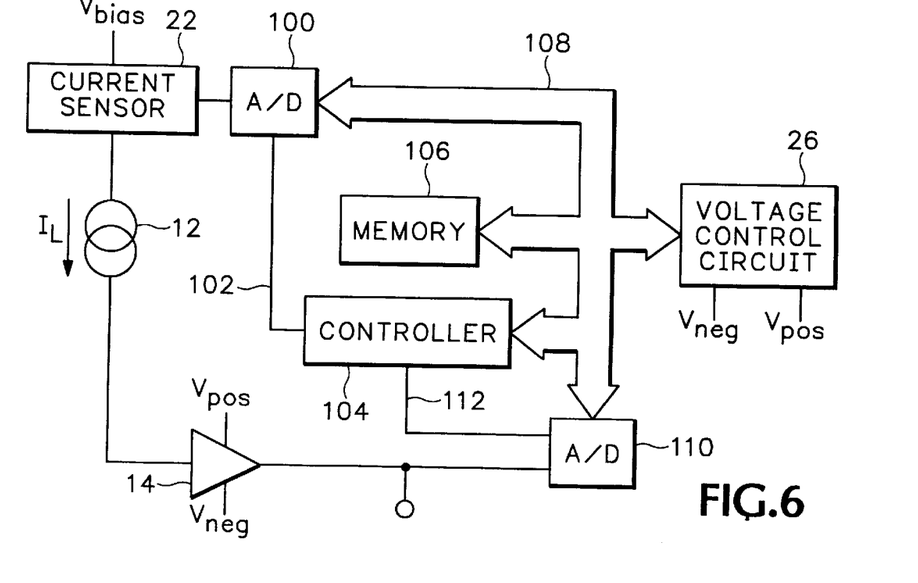
FIG. 6 is representative block diagram of a first digital implementation of the automatic output offset control circuit for a DC-coupled RF amplifier optical-to-electrical converter according to the present invention.

In the preferred embodiment of the present invention, low pass filters are coupled to the RF amplifier 60 output and to the current sensing means 22 output. The closed-loop feedback system is a classic oscillator type system in which the feedback system is sensing and feeding-back much slower than the changes at the input. In the preferred embodiment, the RF amplifier 60 is operating at 2 GHz and the closed-loop feedback system is low pass filtered at 30 Hz by the integrating low pass filter 84. The low pass filter on the current sensing means 22 is implemented as part of the differential amplifier 70 and has the same time constant as the low pass filter function of the unity gain buffer amplifier 64 on the RF amplifier 60 for equalizing the time of arrival of the current sensing means 22 output with the output from the RF amplifier 60, especially in the presence of a signal burst. In the preferred embodiment of the present invention, the operational amplifiers are LT1112 precision operational amplifiers, manufactured and sold by Linear Technology, Inc., Milpitas, Calif., The automatic output offset control circuit for the DC-coupled RF amplifier may be equally implemented digitally. In such a digital implementation, digitization of the current sensing means 22 may be initiated as soon as the current $I_L$ is sensed and continues to the generation of the power supply bias voltages $V_{neg}$ and $V_{pos}$. In the representative block diagram of FIG. 6 showing a digital implementation of the automatic output offset control circuit for a DC-coupled RF amplifier 10 according to the present invention, the first and second signals applied to the common node 68 in the analog implementation are digitized. The analog output of the current sensing means 22 is coupled to the input of analog-to-digital (A/D) converter 100. A/D 100 receives control signals via control line 102 from a controller 104 operating under program control from programs stored in memory 106 for converting the analog input signal into digital values representative of the signal from the generating means. The digital values from the A/D 100 are coupled to the controller 104 via digital bus 108. The analog output from the RF amplifier 60 is coupled to analog-to-digital (A/D) converter 110. A/D 110, receiving control signal via control line 112 from the controller 104 operating under program control, converts the analog input signal from the RF amplifier 60 to digital values representative of the signal from the RF amplifier 60. The digital values from the A/Ds 100 and 110 may be stored in memory 106 that includes a Read Only Memory (ROM) for storing program instructions and a Random Access Memory (RAM) for storing the digital values resulting from the executed programs. The controller 104 under program control compares the digital values from the current sensing means 22 and the RF amplifier 60 and generates digital error values representative of any mismatch between the digital values from the two sources. The controller 104 performs an integrating low pass filter function on the digital error values in response to program controls stored in memory 106 and generates control voltage correction values. The control voltage correction values are coupled to a digitally controlled voltage regulator in the voltage control circuit 26 for generating the power supply bias voltages $V_{neg}$ and $V_{pos}$ to the RF amplifier 60.

The digital implementation of the automatic output offset control circuit for the DC-coupled RF amplifier 10 allows for scaling of one or both of the digitized analog signals from the current sensing means 22 and the RF amplifier 60. In the analog implementation, the gain of the analog signal going into the node 68 need to be the same, whereas in the digital implementation scaling factors may be applied to one or both of the digital values of the analog signal to equalize the gain.

Figure 7:
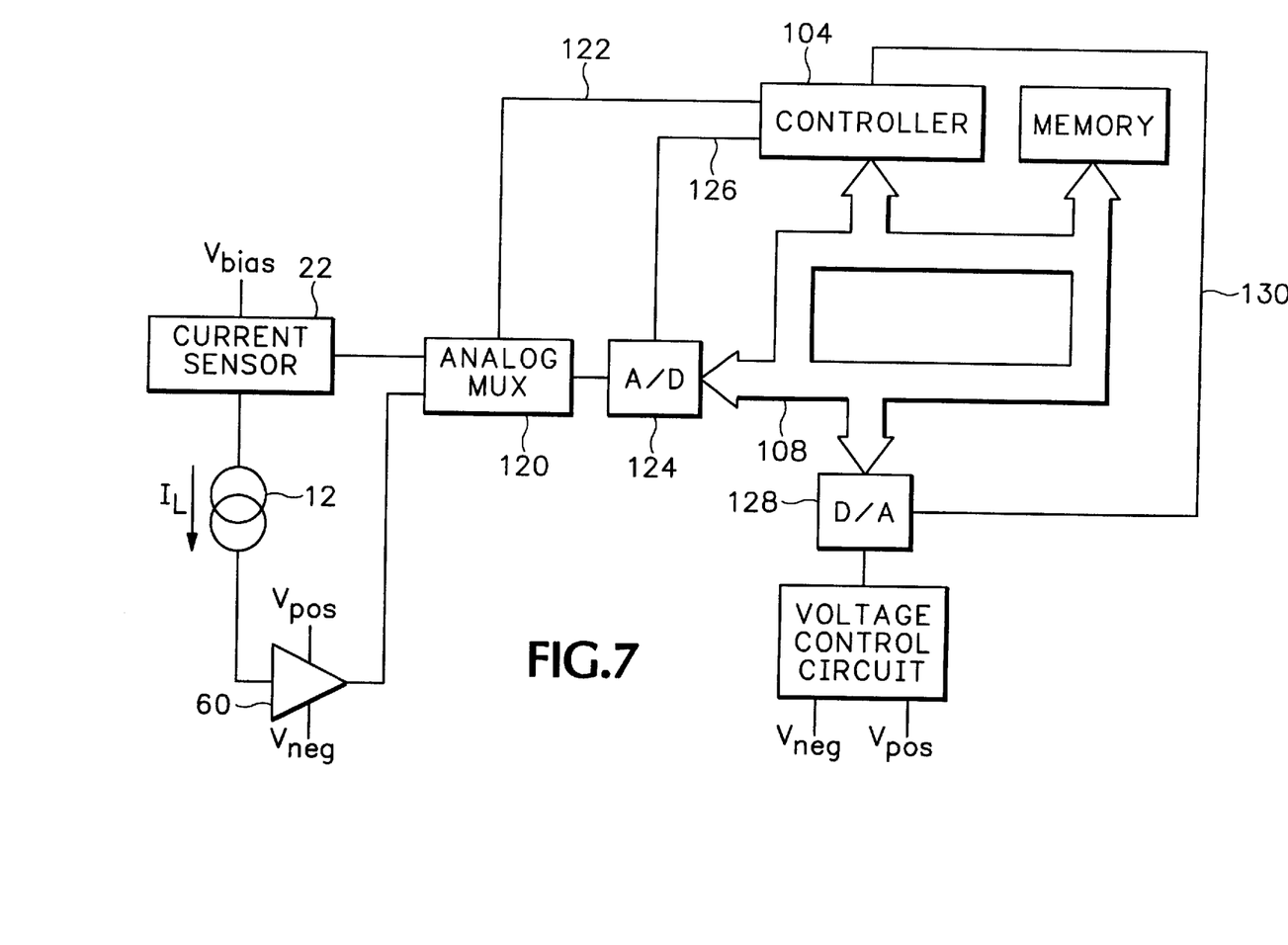
FIG. 7 is representative block diagram of a second digital implementation of the automatic output offset control circuit for a DC-coupled RF amplifier optical-to-electrical converter according to the present invention.

FIG. 7 is an alternative digital implementation of the automatic output offset control circuit for the DC-coupled RF amplifier according to the present invention. An analog multiplexer 120 receives the analog signals from the RF amplifier 60 and the current sensing means 22. The analog MUX 120 receives control signals from the controller 104 via control line 122 for selectively coupling the input signals to the output of the MUX 120. The output of the MUX 120 is coupled to the input of analog-to-digital (A/D) converter 124 that receives control signals from the controller 104 via control line 126. The A/D 124 generates digital values representative of the analog signals from the current sensing means 22 and the RF amplifier 60. The controller 104 under program control compares the digital values from the current sensing means 22 and the RF amplifier 60 and generates digital error values representative of any mismatch between the digital values from the two sources. The digital error values are coupled to the input of digital-to-analog (D/A) converter 128 that converts the digital error values to a corresponding analog error signal in response to control signals from the controller 104 via control line 130. The error signal is coupled to the integrating low pass filter 84 for generating the control voltage correction signal for generating the power supply bias voltages on the RF amplifier.

The above described digital implementations of the present invention may be modified to include elements from each embodiment. For example, the embodiment of FIG. 6 may include the D/A converter 128 and the analog integrating low pass filter of FIG. 7 instead of the controller implemented integrating low pass filter function and the digital voltage regulator. Likewise, the implementation of FIG. 7 may implement the controller 104 integrating low pass filter function and employing a digital voltage regulator of FIG. 6.

An automatic output offset control for a DC-coupled RF amplifier 10 has been described having a current source 12, such as a PIN photodiode, for generating a current input $I_L$ from one side of the current source 12 that drives an amplifier 14. The output of the amplifier 14 is coupled to common node that receives a second input from a current sensing means 22. The current sensing means senses the current $I_L$ on the other side of the current source 12 and generates a signal representative of the current of the current source. Any mismatch between the two signal at the common node generates a differential error signal relative to ground that is coupled to an integrating low pass filter 84. The integrating low pass filter 84 generates a control voltage correction signal that is coupled to a voltage regulator for generating power supply bias voltages, $V_{neg}$ and $V_{pos}$ for the RF amplifier 60 that are proportional to the control voltage. The $V_{neg}$ and $V_{pos}$ bias voltages are adjusted in unison to produce zero offset at the amplifier 14 output for a given amount of $I_L$ current while maintaining a constant AC-gain. While the disclosure is made in terms of a preferred embodiment, the invention is not intended to be so limited. These and other aspects of the present invention are set forth in the appended claims.

What is claimed is:

1. An automatic output offset control circuit for a DC-coupled RF amplified optical-to-electrical converter comprising:

a current source for generating a current output;

an amplifier coupled to receive the current output from one side of the current source for generating a first signal output representative of the current output;

means coupled to the other side of the current source for sensing the current of the current source and generating a second signal proportional to the current passing through it;

means for comparing the first and second signals for generating an error signal representative of any mismatch between the first and second signals; and a voltage control circuit coupled to receive the error signal for generating a power supply bias voltage output to the amplifier to correct DC-coupled output offset drift and variations of the amplifier.

2. The automatic output offset control circuit for a DC-coupled RF amplified optical-to-electrical converter as recited in claim 1 wherein the current source comprises an optical transducer for generating a current from an optical power source.

3. The automatic output offset control circuit for a DC-coupled RF amplified optical-to-electrical converter as recited in claim 1 wherein the optical transducer comprises a PIN photodiode.

4. The automatic output offset control circuit for a DC-coupled RF amplified optical-to-electrical converter as recited in claim 1 wherein the amplifier comprises an RF bipolar amplifier.

5. The automatic output offset control circuit for a DC-coupled RF amplified optical-to-electrical converter as recited in claim 1 wherein the RF bipolar amplifier comprises a bipolar Darlington RF amplifier.

6. The automatic output offset control circuit for a DC-coupled RF amplified optical-to-electrical converter as recited in claim 1 wherein the current sensing means comprises a sensing resistor coupled to sense the current of the current source and a differential amplifier having a first input coupled to one side of the resistor and a second input coupled to the other side of the resistor for generating a voltage output representative of the current passing through the resistor.

7. The automatic output offset control circuit for a DC-coupled RF amplified optical-to-electrical converter as recited in claim 1 wherein the current sensing means comprises a differential amplifier having a first input coupled to a voltage source and a second input coupled to receive a voltage signal representative of the sensed current of the current source for generating a voltage output representative of the current passing through the resistor.

8. The automatic output offset control circuit for a DC-coupled RF amplified optical-to-electrical converter as recited in claim 1 wherein the current sensing means comprises:

an operational amplifier having an inverting input coupled to the current source and a feedback resistor that is coupled to the output of the amplifier and a non-inverting input coupled to a reference voltage for generating a voltage output representative of the current passing through the resistor and the voltage reference; and means for subtracting the voltage reference from the voltage output for generating a voltage representative of the current passing through the resistor.

9. The automatic output offset control circuit for a DC-coupled RF amplified optical-to-electrical converter as recited in claims 6, 7, or 8 wherein the current sensing means further comprises a voltage-to-current converter receiving the voltage output representative of the current passing through the resistor for producing a current mirror having an output equal to the output of the current source.

10. The automatic output offset control circuit for a DC-coupled RF amplified optical-to-electrical converter as recited in claim 1 wherein the comparing means comprises a current summing node coupled to the input of a transimpedance amplifier for generating the error signal.

11. The automatic output offset control circuit for a DC-coupled RF amplified optical-to-electrical converter as recited in claim 1 wherein the comparing means comprises a voltage summing node coupled to the input of a voltage amplifier for generating the error signal.

12. The automatic output offset control circuit for a DC-coupled RF amplified optical-to-electrical converter as recited in claim 1 wherein the voltage control circuit comprises an integrating low pass filter receiving the error signal from the comparing means for generating a control voltage correction signal coupled to a voltage regulator for generating the power supply bias output voltages proportional to the control voltage.

13. The automatic output offset control circuit for a DC-coupled RF amplified optical-to-electrical converter as recited in claim 12 wherein the voltage regulator comprises:

a first voltage regulator circuit receiving the control voltage from the integrator for generating a negative power supply bias voltage proportional to the control voltage; and a second voltage regulator coupled to receive the negative power supply bias voltage through a variable resistor for generating a positive power supply bias voltage wherein the variable resistor is adjusted to produce a nominal difference between the negative power supply bias voltage and the positive power supply bias voltage.

14. The automatic output offset control circuit for a DC-coupled RF amplified optical-to-electrical converter as recited in claim 13 wherein the nominal voltage difference between the negative power supply bias voltage and the positive power supply bias voltage is set in a range of about 10 volts by the variable resistor.

15. The automatic output offset control circuit for a DC-coupled RF amplified optical-to-electrical converter as recited in claim 12 wherein the voltage regulator comprises:

a first transistor receiving the control voltage from the integrator for driving the transistor base for generating a negative power supply bias voltage;

a second transistor for generating a positive power supply bias voltage; and a comparator receiving at one input a summed average value of the inverted negative power supply bias voltage output and the positive power supply bias voltage output and at the other input a reference voltage for generating an output for driving the second transistor base to produce a difference between the negative power supply bias voltage and the positive power supply bias voltage that is equivalent to twice the reference voltage on the comparator.

16. The automatic output offset control circuit for a DC-coupled RF amplified optical-to-electrical converter as recited in claim 1 wherein the comparing means comprises:

a first analog-to-digital converter coupled to receive the first signal for generating digital values representative of the first signal;

a second analog-to-digital converter coupled to receive the second signal for generating digital values representative of the second signal;

a controller operating under program control receiving the digital values representative of the first and second signals for comparing the first and second digital values and generating digital error values representative of any mismatch between the first and second digital values.

17. The automatic output offset control circuit for a DC-coupled RF amplified optical-to-electrical converter as recited in claim 16 wherein the comparing means further comprises a digital-to-analog converter coupled to receive the digital error values for generating the error signal.

18. The automatic output offset control circuit for a DC-coupled RF amplified optical-to-electrical converter as recited in claim 16 wherein the controller further comprises a digital memory for storing the program controls and the first and second digital values and the digital error values.

19. The automatic output offset control circuit for a DC-coupled RF amplified optical-to-electrical converter as recited in claim 16 wherein the controller further comprises an integrator for generating control voltage correction values coupled to the voltage regulator for generating the power supply bias voltages proportional to the control values.

20. The automatic output offset control circuit for a DC-coupled RF amplified optical-to-electrical converter as recited in claim 1 wherein the comparing means comprises:

a multiplexer having an input coupled to receive the first and second signals and an output coupled to selectively receive the first and second signal in response to a control signal;

an analog-to-digital converter coupled to receive the output from the multiplexer for generating digital values representative of the first and second signal;

a controller operating under program control for generating the control signal for selectively coupling the first and second signals to the analog-to-digital converter and receiving the digital values representative of the first and second signals for comparing the first and second digital values and generating digital error values representative of any mismatch between the first and second digital values.

21. The automatic output offset control circuit for a DC-coupled RF amplified optical-to-electrical converter as recited in claim 20 wherein the comparing means further comprises a digital-to-analog converter coupled to receive the digital error values for generating the error signal.

22. The automatic output offset control circuit for a DC-coupled RF amplified optical-to-electrical converter as recited in claim 20 wherein the controller further comprises a digital memory for storing the program controls and the first and second digital values and the digital error values.

23. The automatic output offset control circuit for a DC-coupled RF amplified optical-to-electrical converter as recited in claim 20 wherein the controller further comprises an integrator for generating control voltage correction values coupled to the voltage regulator for generating the power supply bias voltages proportional to the control values.

24. An automatic output offset control circuit for a DC-coupled RF amplified optical-to-electrical converter comprising:

an optical transducer for generating a current output from an optical power source;

a bipolar Darlington RF amplifier coupled to receive the current output from one side of the optical transducer for generating a voltage output representative of the current output;

means for converting the voltage output signal to a first current signal;

means coupled to the other side of the optical transducer for sensing the current of the optical transducer and generating a second current signal proportional to the current passing through it;

means for comparing the first and second current signals for generating an error signal representative of any mismatch in the current signals; and a voltage control circuit coupled to receive the error signal for generating a power supply bias voltage output to the amplifier to correct DC-coupled output offset drift and variations of the amplifier.

25. The automatic output offset control circuit for a DC-coupled RF amplified optical-to-electrical converter as recited in claim 24 wherein the optical transducer comprises a PIN photodiode.

26. The automatic output offset control circuit for a DC-coupled RF amplified optical-to-electrical converter as recited in claim 24 wherein the current sensing means comprises a sensing resistor coupled to sense the current of the optical transducer and a differential amplifier having a first input coupled to one side of the resistor and a second input coupled to the other side of the resistor for generating a voltage output representative of the current passing through the resistor.

27. The automatic output offset control circuit for a DC-coupled RF amplified optical-to-electrical converter as recited in claim 24 wherein the current sensing means comprises a differential amplifier having a first input coupled to a voltage source and a second input coupled to receive a voltage signal representative of the sensed current of the optical transducer for generating a voltage output representative of the current passing through the resistor.

28. The automatic output offset control circuit for a DC-coupled RF amplified optical-to-electrical converter as recited in claim 24 wherein the current sensing means comprises:

an operational amplifier having an inverting input coupled to the optical transducer and a feedback resistor that is coupled to the output of the amplifier and a non-inverting input coupled to a reference voltage for generating a voltage output representative of the current passing through the resistor and the voltage reference; and means for subtracting the voltage reference from the voltage output for generating a voltage representative of the current passing through the resistor.

29. The automatic output offset control circuit for a DC-coupled RF amplified optical-to-electrical converter as recited in claims 26, 27, or 28 wherein the current sensing means further comprises a voltage-to-current converter receiving the voltage output representative of the current passing through the resistor for producing a current mirror having an output equal to the output of the current source.

30. The automatic output offset control circuit for a DC-coupled RF amplified optical-to-electrical converter as recited in claim 24 wherein the comparing means comprises a current summing node coupled to the input of a transimpedance amplifier for generating the error signal.

31. The automatic output offset control circuit for a DC-coupled RF amplified optical-to-electrical converter as recited in claim 24 wherein the voltage control circuit comprises an integrating low pass filter receiving the error signal from the comparing means for generating a control voltage correction signal coupled to a voltage regulator for generating the power supply bias voltages proportional to the control voltage.

32. The automatic output offset control circuit for a DC-coupled RF amplified optical-to-electrical converter as recited in claim 31 wherein the voltage regulator comprises:

a first voltage regulator circuit receiving the control voltage from the integrator for generating a negative power supply bias voltage proportional to the control voltage; and a second voltage regulator coupled to receive the negative power supply bias voltage through a variable resistor for generating a positive power supply bias voltage wherein the variable resistor is adjusted to produce a nominal difference between the negative power supply bias voltage and the positive power supply bias voltage.

33. The automatic output offset control circuit for a DC-coupled RF amplified optical-to-electrical converter as recited in claim 32 wherein the nominal voltage difference between the negative power supply bias voltage and the positive power supply bias voltage is set in a range of about 10 volts by the variable resistor.

34. The automatic output offset control circuit for a DC-coupled RF amplified optical-to-electrical converter as recited in claim 31 wherein the voltage regulator comprises:

a first transistor receiving the control voltage from the integrator for driving the transistor base for generating a negative power supply bias voltage;

a second transistor for generating a positive power supply bias voltage; and a comparator receiving at one input a summed average value of the inverted negative power supply bias voltage output and the positive power supply bias voltage output and at the other input a reference voltage for generating an output for driving the second transistor base to produce a difference between the negative power supply bias voltage and the positive power supply bias voltage that is equivalent to twice the reference voltage on the comparator.

35. The automatic output offset control circuit for a DC-coupled RF amplified optical-to-electrical converter as recited in claim 24 wherein the comparing means comprises:

a first analog-to-digital converter coupled to receive the first signal for generating digital values representative of the first signal;

a second analog-to-digital converter coupled to receive the second signal for generating digital values representative of the second signal;

a controller operating under program control receiving the digital values representative of the first and second signals for comparing the first and second digital values and generating digital error values representative of any mismatch between the first and second digital values.

36. The automatic output offset control circuit for a DC-coupled RF amplified optical-to-electrical converter as recited in claim 35 wherein the comparing means further comprises a digital-to-analog converter coupled to receive the digital error values for generating the error signal.

38. The automatic output offset control circuit for a DC-coupled RF amplified optical-to-electrical converter as recited in claim 35 wherein the controller further comprises a digital memory for storing the program controls and the first and second digital values and the digital error values.

38. The automatic output offset control circuit for a DC-coupled RF amplified optical-to-electrical converter as recited in claim 35 wherein the controller further comprises an integrating low pass filter function for generating control voltage correction values coupled to the voltage regulator for generating the power supply bias voltages proportional to the control values.

39. The automatic output offset control circuit for a DC-coupled RF amplified optical-to-electrical converter as recited in claim 24 wherein the comparing means comprises:

a multiplexer having an input coupled to receive the first and second signals and an output coupled to selectively receive the first and second signal in response to a control signal;

an analog-to-digital converter coupled to receive the output from the multiplexer for generating digital values representative of the first and second signal;

a controller operating under program control for generating the control signal for selectively coupling the first and second signals to the analog-to-digital converter and receiving the digital values representative of the first and second signals for comparing the first and second digital values and generating digital error values representative of any mismatch between the first and second digital values.

40. The automatic output offset control circuit for a DC-coupled RF amplified optical-to-electrical converter as recited in claim 39 wherein the comparing means further comprises a digital-to-analog converter coupled to receive the digital error values for generating the error signal.

41. The automatic output offset control circuit for a DC-coupled RF amplified optical-to-electrical converter as recited in claim 39 wherein the controller further comprises a digital memory for storing the program controls and the first and second digital values and the digital error values.

42. The automatic output offset control circuit for a DC-coupled RF amplified optical-to-electrical converter as recited in claim 39 wherein the controller further comprises an integrating low pass filter function for generating control voltage correction values coupled to the voltage regulator for generating the power supply bias voltages proportional to the control values.

* * * * *